United States Patent
Zheng et al.

(10) Patent No.: US 10,186,846 B2
(45) Date of Patent: *Jan. 22, 2019

(54) SYSTEM AND METHOD FOR TESTING BREAKDOWN VOLTAGE/DIELECTRIC STRENGTH OF SPARK PLUG INSULATORS

(71) Applicant: Fram Group IP LLC, Lake Forest, IL (US)

(72) Inventors: Jing Zheng, Findlay, OH (US); Corey Eiden, Walbridge, OH (US); Matthew B. Below, Findlay, OH (US)

(73) Assignee: Farm Group IP LLC, Lake Forest, IL (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/625,312

(22) Filed: Jun. 16, 2017

(65) Prior Publication Data

US 2017/0288376 A1    Oct. 5, 2017

Related U.S. Application Data

(63) Continuation of application No. 14/813,443, filed on Jul. 30, 2015, now Pat. No. 9,735,553.

(60) Provisional application No. 62/030,974, filed on Jul. 30, 2014.

(51) Int. Cl.
*H01T 13/58* (2011.01)
*G01R 31/12* (2006.01)
*F02P 17/00* (2006.01)
*H01T 13/60* (2011.01)

(52) U.S. Cl.
CPC ............. *H01T 13/58* (2013.01); *F02P 17/00* (2013.01); *G01R 31/12* (2013.01); *G01R 31/1227* (2013.01); *H01T 13/60* (2013.01)

(58) Field of Classification Search
None
See application file for complete search history.

(56) References Cited

U.S. PATENT DOCUMENTS

| | | | | |
|---|---|---|---|---|
| 4,261,085 A | * | 4/1981 | Nishio | H01T 13/38 313/141 |
| 2010/0282197 A1 | * | 11/2010 | Permuy | H01T 19/04 123/143 B |

* cited by examiner

*Primary Examiner* — Ashok Patel
(74) *Attorney, Agent, or Firm* — Barnes & Thornburg LLP; Elizabeth A. Peters

(57) ABSTRACT

A system for testing an insulative material for a spark plug comprises a test spark plug having at least a center electrode and an insulator comprised of an insulative material surrounding at least a portion of the center electrode, wherein the insulator has an end that is closed, whereby the closed end of the insulator encloses an end of the center electrode. The system may further include a test engine that simulates engine conditions, wherein a conventional spark plug is installed in a first ignition port of the test engine and the test spark plug is installed in a second ignition portion of the test engine and a control system for controlling ignition signals to the test spark plug and the conventional spark plug.

10 Claims, 6 Drawing Sheets

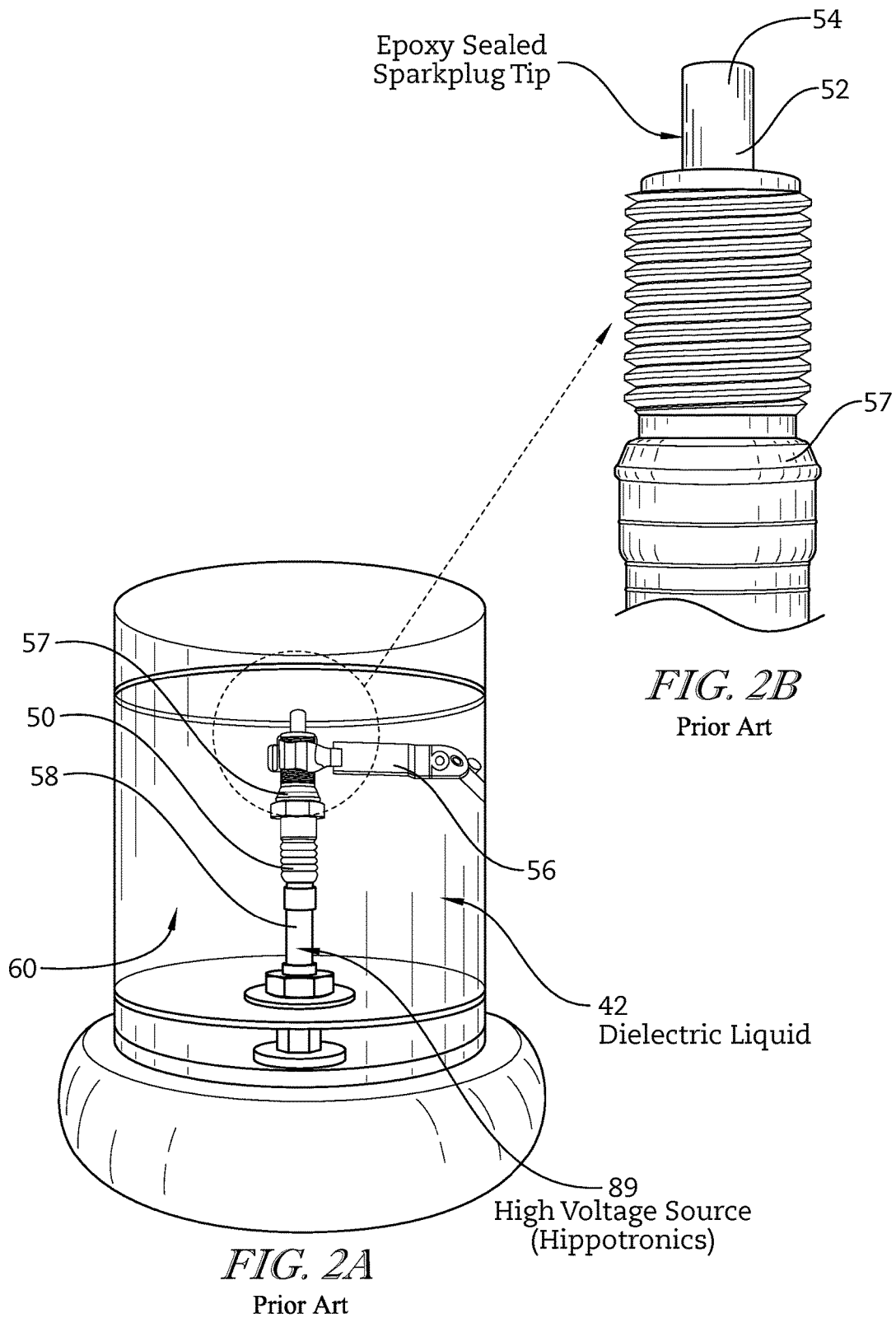

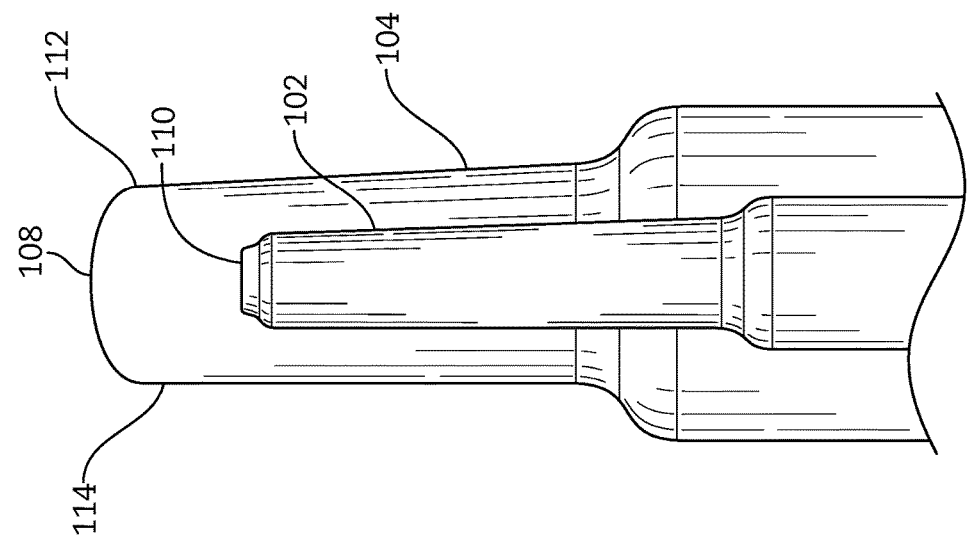
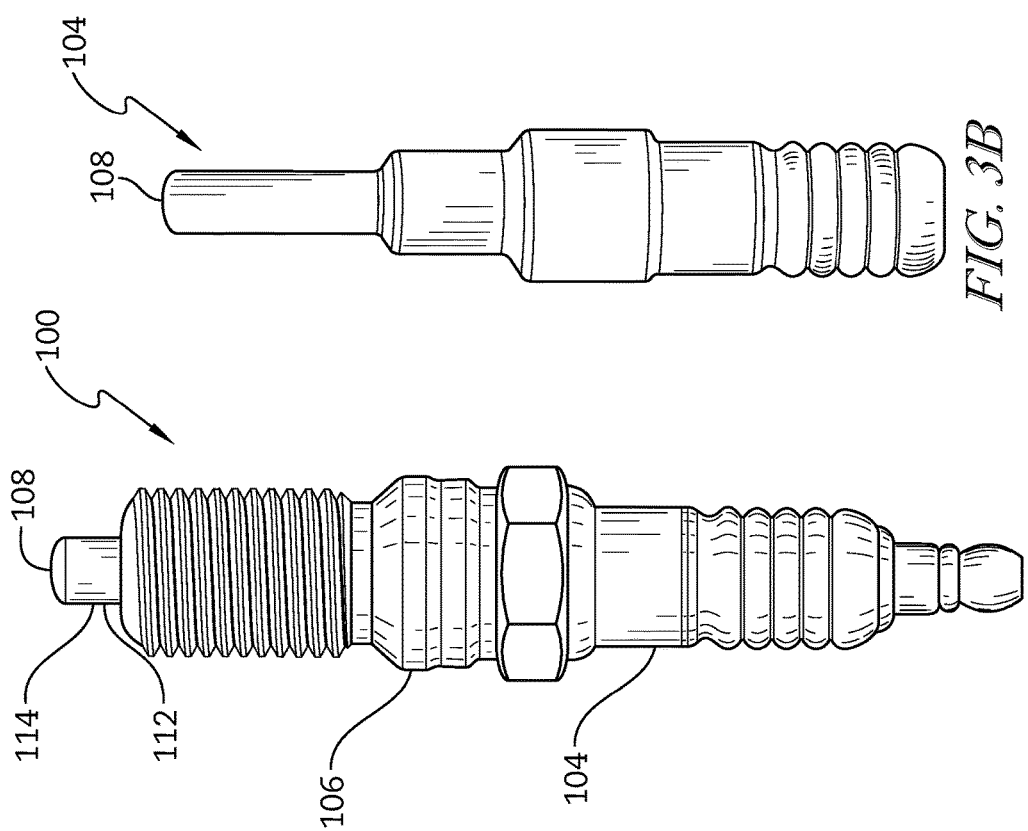

SYSTEM AND METHOD FOR TESTING BREAKDOWN VOLTAGE/DIELECTRIC STRENGTH OF SPARK PLUG INSULATORS

CROSS REFERENCE TO RELATED APPLICATIONS

This application is a continuation of prior application Ser. No. 14/813,443 filed on Jul. 30, 2015, which claims the benefit of priority under 35 U.S.C. § 119(e) to U.S. Provisional Patent Application No. 62/030,974, filed Jul. 30, 2014, the contents of which are incorporated herein by reference in its entirety.

BACKGROUND

1. Field of the Invention

The present invention relates generally to systems and methods for testing spark plug insulators and, more particularly, to systems and methods for testing breakdown voltage/dielectric strength of spark plug insulators.

2. Description of the Background

Because of the trend of engine downsizing, longer and thinner spark plugs are needed to work with newer engines. These next generation spark plugs require high dielectric strength insulators, which offer reduced dimensions but better or at least equivalent performance when compared to a traditional sparkplug. Typically, ASTM D-149 is used to measure the dielectric strength of insulative materials, which tests the breakdown voltage the insulative material can resist at a certain thickness with a set of parallel electrodes. However, because of the complex geometry of spark plug insulators, as well as the aggressive manufacturing process, there is not always a direct correlation between the performance of the insulator and ASTM D-149 measurements.

In the spark plug industry, there are two most commonly used methods for testing the breakdown voltage/dielectric strength of an insulator, as shown in FIGS. 1, 2A, and 2B. In a first method, as shown in FIG. 1, a system is created with a spark plug assembly including a spark plug insulator 20 surrounding a spark plug center electrode 22. A first end 24 of a first wire contact 26 is wound around an end 28 of the center electrode 22 and a second end 30 of the first wire contact 26 is connected to a high voltage source (not shown), for example, a high voltage system as sold by Hipotronics of Brewster, N.Y. A first end 32 of a second wire contact 34 is wound around an end 36 of the insulator 20 opposite the end 28 of the center electrode 22 and a second end 38 of the second wire contact 34 is connected to a ground contact 40. The entire system is placed in dielectric fluid 42 during testing of a spark plug insulator 20, as shown in FIG. 2.

In a second method, as seen in FIGS. 2A and 2B, a system is created with a spark plug assembly including a spark plug insulator 50 surrounding a spark plug center electrode 52. A tip 54 at a first end of the spark plug center electrode 52 is sealed with epoxy and a ground contact 56 is connected to a portion of a metal shell 57 surrounding the insulator 50 adjacent the tip 54. A second end 58 of the center electrode 52 is connected to a high voltage source 59, for example, a system as sold by Hipotronics of Brewester, N.Y. As with the first test method, the entire system of the second test method is placed in dielectric fluid 42 during testing of a spark plug insulator 50.

The methods of FIGS. 1, 2A, and 2B both involve using dielectric fluid to prevent spark and flashover during testing. Unfortunately, the use of dielectric fluid has limited the temperature capabilities of the tests and imposes confounding effects on dielectric breakdown of the insulator. Furthermore, the design of the electrodes (wire, as seen in FIG. 1, and shell, as seen in FIGS. 2A and 2B) leads to a concentrated electric field in a localized area of the insulator, and hence, the results are not representative of the performance of the insulator as a whole.

Accordingly, there is a need for a system and method for testing insulative materials for use in spark plugs to more accurately determine breakdown voltage/dielectric strength.

SUMMARY

In illustrative embodiments, a system for testing an insulative material for a spark plug comprises a test spark plug having at least a center electrode and an insulator comprised of an insulative material surrounding at least a portion of the center electrode, wherein the insulator has an end that is closed, whereby the closed end of the insulator encloses an end of the center electrode. The system may further include a test engine that simulates engine conditions, wherein a conventional spark plug is installed in a first ignition port of the test engine and the test spark plug is installed in a second ignition portion of the test engine, and a control system for controlling ignition signals to the test spark plug and the conventional spark plug.

In other illustrative embodiments, a method of testing an insulative material for a spark plug may comprise the step of providing a test spark plug having at least a center electrode and an insulator comprised of an insulative material surrounding at least a portion of the center electrode, wherein the insulator has an end that is closed, whereby the closed end of the insulator encloses an end of the center electrode. The method may further comprise the steps of installing the test spark plug and a conventional spark plug in first and second ignition portions, respectively, of a test engine and controlling ignition signals to the test spark plug and the conventional spark plug.

BRIEF DESCRIPTION OF THE DRAWINGS

The foregoing and other features, and advantages of the disclosure are apparent from the following detailed description taken in conjunction with the accompanying drawings in which:

FIG. 2A is an isometric view of a set-up of a second system and method for testing breakdown voltage/dielectric strength of an insulator of a spark plug assembly;

FIG. 2B is an enlarged view of a portion of the spark plug assembly of FIG. 2A;

FIG. 3A is a side elevational view of a spark plug assembly for use with the systems and methods of the present disclosure and generally including a center electrode, an insulator, and a metal shell, wherein an end of the insulator is closed;

FIG. 3B is a side elevational of the insulator of FIG. 3A having a closed end;

FIG. 4 is a phantom view of portions of the spark plug assembly of FIG. 3A depicting the closed end of the insulator;

Figure 1:
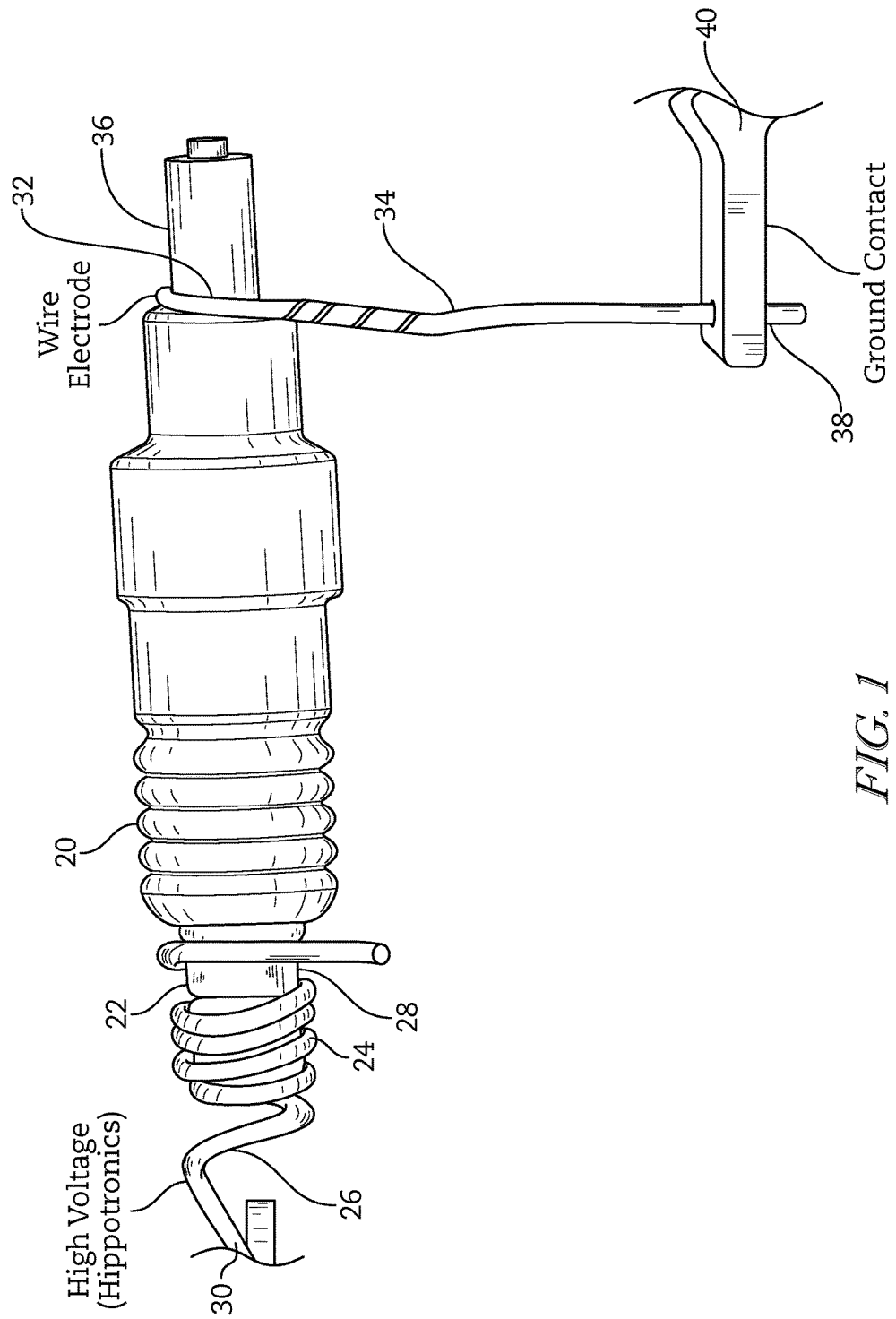
FIG. 1 is a side elevational view depicting a set-up of a first system and method for testing breakdown voltage/dielectric strength of an insulator of a spark plug assembly.

The subject matter is particularly pointed out and distinctly claimed in the claims at the conclusion of the specification.

Other aspects and advantages of the present invention will become apparent upon consideration of the following detailed description, wherein similar structures have like or similar reference numerals.

DETAILED DESCRIPTION

The present application is directed to systems and methods for testing a breakdown voltage/dielectric strength of insulators for spark plugs. While the systems and methods of the present application may be embodied in many different forms, several specific embodiments are discussed herein with the understanding that the present application is to be considered only as an exemplification of the principles of the application, and it is not intended to limit the application to the embodiments illustrated.

In order to better evaluate the dielectric performance of spark plug insulators with new ceramic materials, a system and method for testing spark plug insulators involving a test engine and a specially designed insulator has been developed. The test system and method utilizes a test engine to generate a testing environment similar to that of a real world application within a production engine (i.e., temperature, combustion gas product, etc.). Also, because of the low ionization voltage of combustion gases (i.e., similar to air), the electric field concentration due to complex electrode geometry (i.e., spark plug shell) is also minimized to allow the evaluation of an entire tip of the insulator.

The test systems and methods disclosed herein include three components: (1) a spark plug assembly with a specially designed insulator for testing purposes, (2) a test engine with dual spark plugs, and/or (3) an electric/ignition control unit.

FIGS. 3A, 3B, and 4 depict a spark plug assembly 100 with a specially designed insulator 104 for use with the systems and methods of the present disclosure. The spark plug assembly 100 is similar to a traditional spark plug assembly in that it includes a center electrode or centerwire 102, an insulator 104 surrounding the center electrode 102, and a metal shell 106 at least partially surrounding the insulator 104. The spark plug assembly 100 is different than traditional spark plug assemblies in that an end 108 of the insulator 104 is spaced from a tip 110 of the center electrode 102 and is closed. In an illustrative embodiment, the closed end 108 of the insulator 104 may be made of the same or a different material than a remainder of the insulator 104. In an illustrative embodiment in which the closed end 108 is made of a different material than the remainder of the insulator 104, the closed end 108 may be made of, for example, glass and/or potting materials.

The closed end 108 of the insulator 104 will confine the electric field between the center electrode 102 and the metal shell 106 so that arcing or flashing does not occur between the center electrode 102 and a ground electrode (not shown). This will ensure a location of puncture that signifies failure of the insulator 104 is through a side wall 112 of a nose 114 of the insulator 104 and hence, testing the actual performance of the insulator 104. The thickness of the ceramic at the closed end 108 of the insulator 104 may be varied from about 0.02 inch to about 0.2 inch. If the ceramic at the closed end 108 is too thin, it runs into the risk of puncturing at the closed end 108 instead of through the side wall 112 of the nose 114. If the ceramic at the closed end 108 is too thick, the closed end 108 of the insulator 104 may protrude into the engine too deep and interfere with the movement of the engine components (i.e., the piston and/or the intake/exhaust valves). The closed end 108 of the insulator 104 is pressure sealed with a resistor/contact glass and then is assembled with the metal shell 106 to form the spark plug assembly to form test samples for the systems and methods described herein.

It is noteworthy that, because of the added ceramic thickness at the closed end 108 of the insulator 104, the insulator 104 will protrude further into the combustion chamber of the engine when installed. Accordingly, test spark plug assembly 100 disclosed herein is likely to experience higher temperature in comparison to spark plug assemblies having an insulator with an open end (and not extending beyond a tip for the center electrode) during similar engine conditions. This is likely to cause the test spark plug assemblies 100 with insulators 104 having closed ends 108 to fail at lower breakdown voltages.

Figure 5:
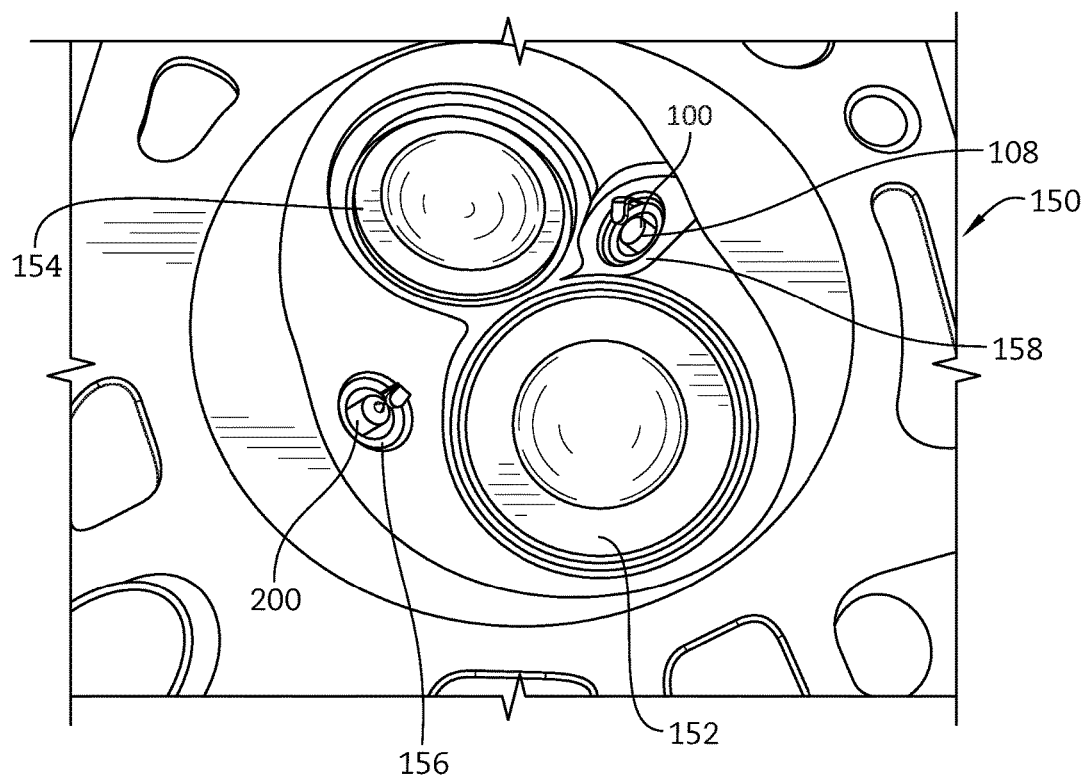
FIG. 5 depicts an internal view of a combustion chamber of a cylinder head of a test engine for use in the systems and methods of testing breakdown voltage/dielectric strength of an insulator of a spark plug assembly as disclosed herein.

As noted above, a second aspect of the systems and methods disclosed herein is the use of a test engine 150 with dual ignition spark plugs, as seen in FIG. 5, to test the test spark plug assembly 100. Test engine 150 provides conditions that mimic the conditions in a production engine. Test engine 150 is used to control different ignition conditions, thereby simulating the engine environment during different driving conditions, which generates different combustion atmospheres, temperatures, cylinder pressures, etc. More specifically, a load is placed on the test engine to mimic different real world conditions. These load conditions impact the effects on the insulator material under electric stress and lead to dielectric breakdown at different levels. Therefore, using a test engine 150 in combination with the test spark plug assembly 100 allows for testing of the dielectric performance of the spark plug at different driving conditions with repeatable results. As seen in FIG. 5, the test engine 150 includes two spark plugs per cylinder to determine a more accurate breakdown voltage/dielectric strength of the insulator in the test spark plug assembly 100.

The test systems and methods presented herein more accurately determine breakdown voltage/dielectric strength because of the use of dual spark plugs, with a first spark plug 200 located close to an exhaust valve 152 of the test engine 150 and the test spark plug 100 located close to an intake valve 154 of the test engine. During the test methods described herein, a standard or conventional spark plug 200, which can be acquired off-the-shelf, may be installed in a first ignition port 156 while a test spark plug assembly 100, including the insulator 104 with the closed end 108, may be installed in a second ignition port 158. In an alternative illustrative embodiment, the conventional spark plug 200 may be installed in the second ignition port 158 and the test spark plug assembly 100 may be installed within the first ignition port 156. During testing, voltage is supplied to the spark plugs 200 and 100, via ignition coils, in order to simulate normal usage (i.e., voltage that is used to cause the center electrode within a spark plugs to fire), as discussed in more detail below. As testing occurs in the present test set-up, only the conventional spark plug 200 will spark to ignite fuel, thereby generating a combustion environment similar to a desired driving condition (i.e., based on various factors). While subjecting the engine to real-time combustion conditions, the test spark plug assembly 100 (which has the insulator 104 having a closed end 108) is thereby subjected to a controlled ramp of ignition voltage until the insulator 104 is electrically punctured. The voltage at which the insulator 104 breaks down, as well as other characteristics of the test (including temperature, time, size of spark plug, etc) will then be recorded to represent the dielectric performance of the test spark plug assembly 100, and more specifically the performance of the insulator material and make-up of the insulator 104.

Figure 7:
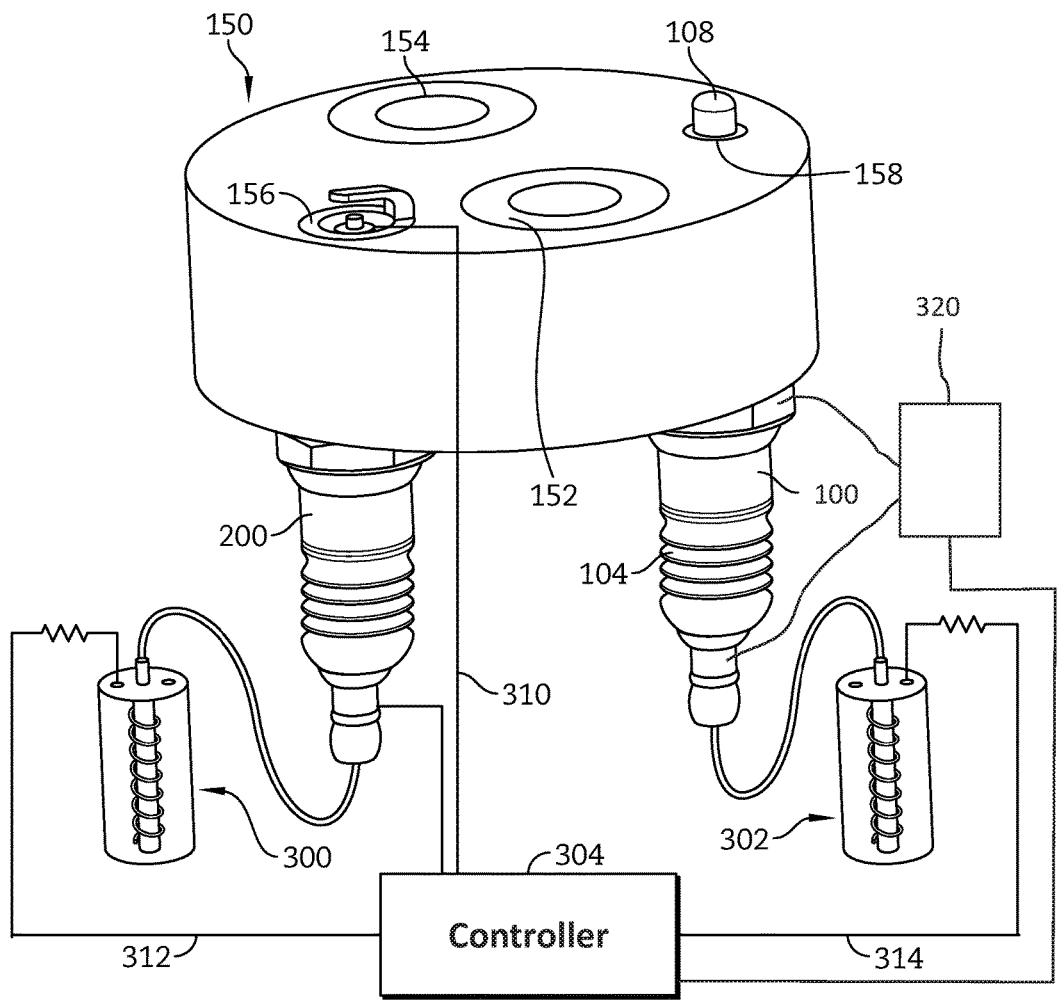
FIG. 7 is a perspective view of a diagram of the dielectric testing apparatus used to test dielectric strength of the insulating material.

The third and last component of the test systems and methods disclosed herein is an electric/ignition control system. As illustrated in FIG. 7, separate ignition coils 300 and 302 are used for each spark plug, in part because different ignition voltages may be applied to the conventional spark plug 200 (e.g. ignition voltage) and the test spark plug assembly 100 (e.g. elevated test voltage). Main ignition coil 300 provides a consistent voltage to conventional spark plug 200 in order to provide the necessary spark to ignite the air/fuel mixture in the combustion chamber. Variable ignition coil 302 is used to provide variable voltage to the test spark plug assembly 100. Variable ignition coil 302 is controlled by the controller 304 to apply an increasing voltage to the test spark plug assembly 100 until a voltage leak occurs in the insulator 104.

More particularly, controller 304 receives an ignition signal from a firing spark plug (the conventional spark plug 200 that fires from operation of the main ignition coil 300) and uses the signal to control the variable ignition coil 302 to apply increasing voltage to the test spark plug 100 at a programmable ramping schedule. In illustrative embodiments, the ignition signal may be transmitted to the controller 304 via an electronic signal path 310, and the controller 304 controls the ignition coils 300 and 302 via electrical signal paths 312 and 314, as illustrated in FIG. 7. A delay of "firing" of an applied voltage to the test spark plug 100 may be controlled with a program so that a combustion front on the conventional spark plug 200 will be at or past that of the test spark plug 100, to cause the test spark plug 100 to simulate an actual firing condition similar to the conventional spark plug 200. It has been discovered that, a delayed ignition/prolonged coil charge time can be used to control a level of the ignition voltage.

Controller 304 can be used to start test engine 150 and controls main ignition coil 300 to apply a voltage to conventional spark plug 200. Alternatively, a separate control system can be used to control test engine 150 and operating conditions. Controller is programmed to run the test engine 150 to a desired temperature and RPM, controller 304 can also place a load on test engine 150 to simulate a motor vehicle towing a load or going up a grade. Once test engine 150 is at the desired RPM and temperature, the controller 304 initiates variable ignition coil 302 at a starting voltage in kilovolts (Kv). Since the operator typically has a sense for the voltage range that a test insulator would puncture, the controller 304 is programmed to initiate a starting voltage of a desired voltage such as 38 kilovolts, for example. Lower or higher starting voltages can also be used as desired. Voltage from variable ignition coil 302 is measured by a high voltage probe 320 that measures the voltage between center electrode 102 and metal shell 106 of test spark plug assembly 100. High voltage probe 320 measures approximately 50 voltage spikes at a first voltage before the controller 304 increases the output voltage of the variable ignition coil 302 by a set incremental amount. For example, high voltage probe 320 measures 50 voltage spikes per second at 38Kv before the controller 304 increases the voltage to 39Kv. High voltage probe 320 then measures 50 voltage spikes per second at 39 Kv before the controller 304 increases the output voltage to 40 Kv. Controller 304 continues to increase the output voltage of variable ignition coil 302 until there is a drop in voltage read by the high voltage probe 320 due to a puncture of the insulator 104. For example, high voltage probe 320 may have a voltage reading of 42 Kv followed by a drop in voltage down to 15-20 Kv indicating that a puncture in the insulator 104 has occurred. The user evaluates the data from the high voltage probe 320 recorded by the controller 304 and determines the highest voltage before the voltage drop. The highest voltages recorded before puncture provides an indicator as to the strength of the insulator 104.

Figure 6:
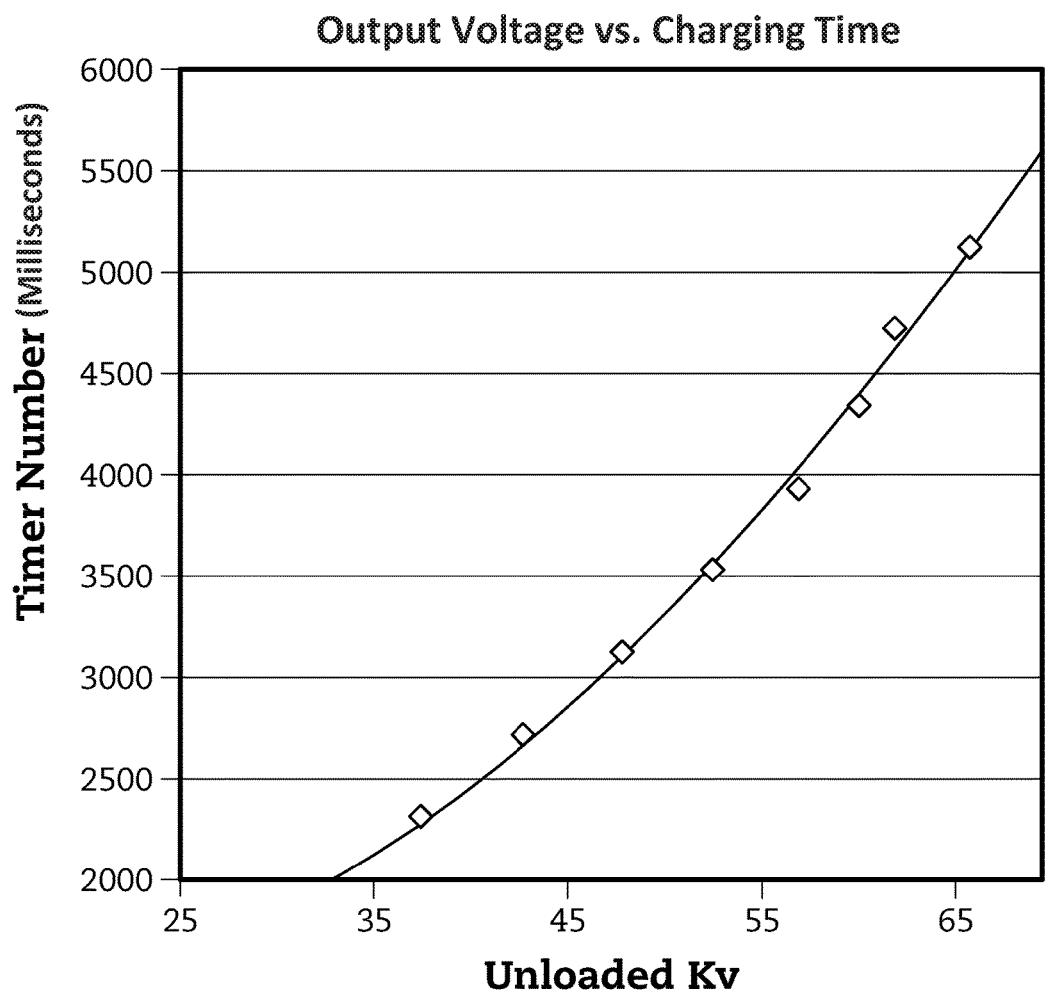
FIG. 6 depicts a correlation between output voltage of an ignition coil to a charging time.

The graph of FIG. 6 depicts a correlation between output voltage of the variable ignition coil 302 to a charging time. As the charging time increases, the ignition voltage increases. This arrangement allows the system to better control applied ignition voltage on the test spark plug assembly 100 with a repeatable and consistent ignition voltage, which allows for repeatable results in breakdown voltage/dielectric strength. Ignition voltage is affected by many variables, such as spark plug electrode gap distance, cylinder pressure, cylinder temperature, combustion byproducts, etc. and, hence, ignition voltage is very difficult to control. Determining the correlation between output voltage of ignition control and charging time allows one to control ignition voltage of a test spark plug and, hence, allows for testing of the test spark plug repeatedly until breakdown. Without this method, there may be no means to control ignition voltage at a targeted level.

A method of using the system described above includes the steps of preparing the test spark plug assembly 100. In particular, the test spark plug assembly 100 may be assembled in any suitable manner, for example, by inserting the center electrode 102 into the insulator 104 with the closed end 108 and, thereafter, attaching the metal shell 106 to the center electrode 102/insulator 104 combination. The closed end 108 of the insulator 104 may be shaped during formation of the insulator 104 and may be pressure sealed with a resistor/contact glass prior to or after being assembled with the center electrode 102. Further, the insulator 104 may be pressure sealed with a resistor/contact glass prior to or after being assembled with the metal shell 106. Other methods of preparing the test spark plug assembly 100 as herein described are envisioned.

Once the test spark plug assembly 100 is fully assembled, the conventional spark plug 200 and the test spark plug 100 are installed within the appropriate ignition ports, as detailed above. Thereafter, the test engine is turned on to run at a selected set of conditions (which can be programmed via the control box) from about 15 to about 30 minutes to reach a steady condition. An illustrative test engine set of conditions may be: 2500 rotations per minute (RPM) and 30% open throttle, and an estimated insulator tip temperature is about 530 degrees Celsius. The RPM may be varied from about 800 RPM to about 4000 RPM and the open throttle may be varied from about 20% to about 100% open throttle.

While the present disclosure has been described in detail in connection with only a limited number of embodiments, it should be readily understood that the disclosure is not limited to such disclosed embodiments. Rather, the disclosure can be modified to incorporate any number of variations, alterations, substitutions or equivalent arrangements not heretofore described, but which are commensurate with the spirit and scope of the disclosure. Additionally, while various embodiments of the present disclosure have been described, it is to be understood that aspects of the disclosure may include only some of the described embodiments.

Accordingly, the present disclosure is not to be seen as limited by the foregoing description, but is only limited by the scope of the appended claims.

We claim:

1. A spark plug, comprising:
a center electrode having a first end and a spaced apart second end; and
an insulator formed of an insulative material surrounding at least a portion of the center electrode, wherein the insulator has an end that is closed, and whereby the closed end of the insulator encloses the second end of the center electrode.

2. The spark plug of claim 1, wherein the closed end of the insulator has a thickness of between about 0.02 inches and about 0.2 inches.

3. The spark plug of claim 1, wherein the closed end of the insulator is shaped during formation of the insulator and is pressure sealed with a resistor or contact glass prior to or after being assembled with the center electrode.

4. The spark plug of claim 1, further comprising a metal shell partially surrounding the insulator.

5. The spark plug of claim 4, wherein the insulator is pressure sealed with a resistor or contact glass prior to or after being assembled with the metal shell.

6. The spark plug of claim 4, wherein the insulator confines an electric field of the spark plug between the center electrode and the metal shell.

7. The spark plug of claim 1, wherein the second end of the center electrode comprises a tip of the center electrode.

8. The spark plug of claim 1, wherein the closed end of the insulator is made of different material than a remainder of the insulator.

9. The spark plug of claim 1, wherein the closed end of the insulator comprises glass or potting materials.

10. The spark plug of claim 1, wherein the closed end of the insulator is rounded in shape.

* * * * *

UNITED STATES PATENT AND TRADEMARK OFFICE
CERTIFICATE OF CORRECTION

PATENT NO. : 10,186,846 B2
APPLICATION NO. : 15/625312
DATED : January 22, 2019
INVENTOR(S) : Jing Zheng, Corey Eiden and Matthew B. Below Page 1 of 1

It is certified that error appears in the above-identified patent and that said Letters Patent is hereby corrected as shown below:

On the Title Page

The Assignee (Item (73)) Farm Group IP LLC should read Fram Group IP LLC

Signed and Sealed this
Seventh Day of April, 2020

Andrei Iancu
*Director of the United States Patent and Trademark Office*